United States Patent
Shi

(10) Patent No.: US 10,720,423 B2
(45) Date of Patent: Jul. 21, 2020

(54) ESD PROTECTION CIRCUIT, DISPLAY PANEL, AND DISPLAY DEVICE

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventor: Longqiang Shi, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 305 days.

(21) Appl. No.: 15/740,704

(22) PCT Filed: Nov. 1, 2017

(86) PCT No.: PCT/CN2017/108895
§ 371 (c)(1),
(2) Date: Dec. 28, 2017

(87) PCT Pub. No.: WO2019/075779
PCT Pub. Date: Apr. 25, 2019

(65) Prior Publication Data
US 2019/0385998 A1    Dec. 19, 2019

(30) Foreign Application Priority Data
Oct. 18, 2017    (CN) .......................... 2017 1 0972927

(51) Int. Cl.
H01L 27/02    (2006.01)
H01L 27/12    (2006.01)

(52) U.S. Cl.
CPC ........ *H01L 27/027* (2013.01); *H01L 27/0292* (2013.01); *H01L 27/1244* (2013.01)

(58) Field of Classification Search
None
See application file for complete search history.

(56) References Cited

U.S. PATENT DOCUMENTS

2018/0233498 A1* 8/2018 Xu .................... G02F 1/136204

* cited by examiner

*Primary Examiner* — Jack S Chen
(74) *Attorney, Agent, or Firm* — Hemisphere Law, PLLC; Zhigang Ma

(57) ABSTRACT

This invention discloses an ESD protection circuit. The ESD protection circuit is arranged on a display panel. It comprises a first conductive via layer electrically connected with a first signal line for outputting signal and a second signal line for inputting signal, and a thin film transistor. A gate of the thin film transistor is electrically connected with a drain, and the second signal line is electrically connected with the gate and/or the drain of the thin film transistor, and the first signal line is electrically connected with a source of the thin film transistor. This invention also discloses a display panel and a display device. In the present invention, the disconnection of the signal line due to electrostatic breakdown is solved.

15 Claims, 2 Drawing Sheets

ESD PROTECTION CIRCUIT, DISPLAY PANEL, AND DISPLAY DEVICE

RELATED APPLICATIONS

The present application is a National Phase of International Application Number PCT/CN2017/108895, filed Nov. 1, 2017, and claims the priority of China Application No. 201710972927.5, filed Oct. 18, 2017.

FIELD OF THE DISCLOSURE

This invention is related to display panel technology, especially related to an ESD protection circuit, a display panel and a display device.

BACKGROUND

To prevent the electrostatic breakdown during the manufacturing process and transportation from damaging the circuit and the conductive layout, the ESD protection circuit is implemented in the conventional circuit design.

With reference to FIG. 1 and FIG. 2, the input signal G_in is delivered via the signal line 2' into the second metal layer L2 of the display panel. The output signal G_out is passed out from first metal line L1 through the signal line 1'. The ESD protection function is realized by the conductive via layer 3' electrically bridged between the first metal layer L1 and the second metal layer L2. It's equant to dispose an equivalent resistance between signal line 2' of the input signal G_in and the signal line 1' of the output signal G_out (shown in FIG. 3). Therefore, the static electricity accumulated on the signal line 2' of the input signal G_in would be released while passing through the equivalent resistance. The damage of the electrostatic breakdown can be avoided.

However, the above mentioned ESD protection has certain disadvantages. For example, the conductive via layer 3' would be disconnected due to the overloaded static electricity accumulation (shown in FIG. 4) and the output function of the display panel would be abnormal.

SUMMARY

In the embodiment of the present invention, it provides an ESD protection circuit, a display panel, and a display device. It can solve the disconnection of the conductive via layer due to the overloaded static electricity accumulation.

To solve the above-mentioned technical problems, this invention provides an ESD protection circuit disposed on a display panel. The ESD protection circuit comprises a first conductive via layer electrically connected with a first signal line for outputting signal and a second signal line for inputting signal, and a thin film transistor. A gate of the thin film transistor is electrically connected with a drain, and the second signal line is electrically connected with the gate and/or the drain of the thin film transistor, and the first signal line is electrically connected with a source of the thin film transistor.

In one of the embodiments, the gate of the thin film transistor and the first signal line are a first metal layer of the display panel, and the source and the drain of the thin film transistor and the second signal line are a second metal layer of the display metal. The gate of the thin film transistor is connected to the drain of the thin film transistor with a second conductive via layer, the drain of the thin film transistor is electrically connected to the second signal line, and the source of the thin film transistor is connected to the first signal line with a third conductive via layer.

In another embodiment of the present invention, an active layer disposed between the gate and the source and the drain for forming a conductive channel, wherein the active layer is disposed between the first metal layer and the second metal layer.

In the other embodiment, the first conductive via layer, the second conductive via layer and the third conductive via layer are formed with ITO.

In the other embodiment, the voltage of the gate, the source and the drain of the thin film transistor are the same, and the thin film transistor is OFF when the first signal line is connected to the second signal line with the first conductive via layer.

In the other embodiment, the voltage of the gate of the thin film transistor is higher than the voltage of the source of the thin film transistor, and the thin film transistor is ON when the first signal line is disconnected to the second signal line with the first conductive via layer.

This invention also provides a display panel. The display panel comprises an ESD protection circuit. The ESD protection circuit comprises:
a first conductive via layer electrically connected with a first signal line for outputting signal and a second signal line for inputting signal, and a thin film transistor. A gate of the thin film transistor is electrically connected with a drain, and the second signal line is electrically connected with the gate and/or the drain of the thin film transistor, and the first signal line is electrically connected with a source of the thin film transistor.

In one of the embodiment, the gate of the thin film transistor and the first signal line are a first metal layer of the display panel, and the source and the drain of the thin film transistor and the second signal line are a second metal layer of the display metal; wherein the gate of the thin film transistor is connected to the drain of the thin film transistor with a second conductive via layer, the drain of the thin film transistor is electrically connected to the second signal line, and the source of the thin film transistor is connected to the first signal line with a third conductive via layer.

In another of the embodiments, it comprises an active layer disposed between the gate and the source and the drain for forming a conductive channel, wherein the active layer is disposed between the first metal layer and the second metal layer.

In the other embodiment, the first conductive via layer, the second conductive via layer and the third conductive via layer are formed with ITO.

In the other embodiment, the voltage of the gate, the source and the drain of the thin film transistor are the same, and the thin film transistor is OFF when the first signal line is connected to the second signal line with the first conductive via layer.

In the other embodiment, the voltage of the gate of the thin film transistor is higher than the voltage of the source of the thin film transistor, and the thin film transistor is ON when the first signal line is disconnected to the second signal line with the first conductive via layer.

Besides, this invention further provides a display device which comprises a display panel and an ESD protection circuit on the display panel. The ESD protection circuit comprises:
a first conductive via layer electrically connected with a first signal line for outputting signal and a second signal line for inputting signal, and a thin film transistor. A gate of the thin film transistor is electrically connected with a drain, and the second signal line is electrically connected with the gate and/or the drain of the thin film transistor, and the first signal line is electrically connected with a source of the thin film transistor.

In one of the embodiments, the gate of the thin film transistor and the first signal line are a first metal layer of, the display panel, and the source and the drain of the thin film transistor and the second signal line are a second metal layer of the display metal; and the gate of the thin film transistor is connected to the drain of the thin film transistor with a second conductive via layer, the drain of the thin film transistor is electrically connected to the second signal line, and the source of the thin film transistor is connected to the first signal line with a third conductive via layer.

In anther embodiment, an active layer disposed between the gate and the source and the drain for forming a conductive channel, wherein the active layer is disposed between the first metal layer and the second metal layer.

In the other embodiment, the first conductive via layer, the second conductive via layer and the third conductive via layer are formed with ITO.

In the other embodiment, the voltage of the gate, the source and the drain of the thin film transistor are the same, and the thin film transistor is OFF when the first signal line is connected to the second signal line with the first conductive via layer.

In the other embodiment, the voltage of the gate of the thin film transistor is higher than the voltage of the source of the thin film transistor, and the thin film transistor is ON when the first signal line is disconnected to the second signal line with the first conductive via layer.

In comparison with the conventional ESD protection circuit, this invention provides a thin film transistor electrically bridged between the first conductive layer and the second conductive layer. When the overloaded static electricity accumulation occurs and the first conductive via layer is disconnected, the electrical connection between the first metal layer and the second metal layer can be maintained due to the activation of the thin film transistor. This can solve the output issues of the disconnection of the conductive via layer due to the overloaded static electricity accumulation.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

The specific structural and functional details disclosed herein are only representative and are intended for describing exemplary embodiments of the disclosure. However, the disclosure can be embodied in many forms of substitution, and should not be interpreted as merely limited to the embodiments described herein.

Figure 1:
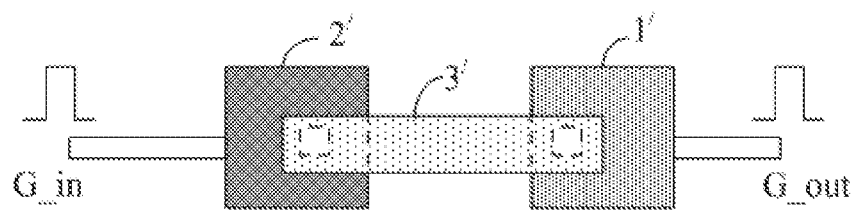
FIG. 1 is the conventional structure of the ESD protection circuit of the display panel.
Figure 2:
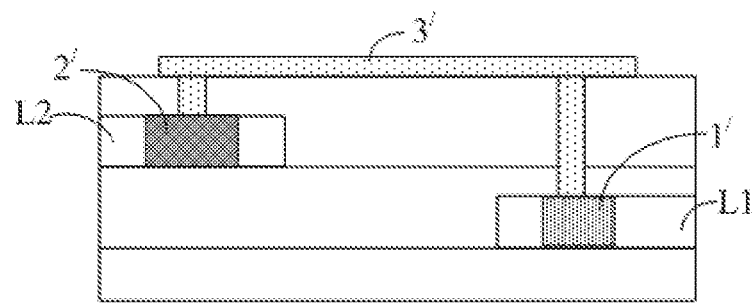
FIG. 2 is the cross-sectioned view of the ESD protection circuit in FIG. 1.
Figure 3:
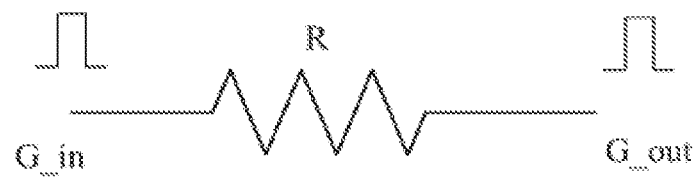
FIG. 3 is the equivalent diagram of the circuit in FIG. 1.
Figure 4:
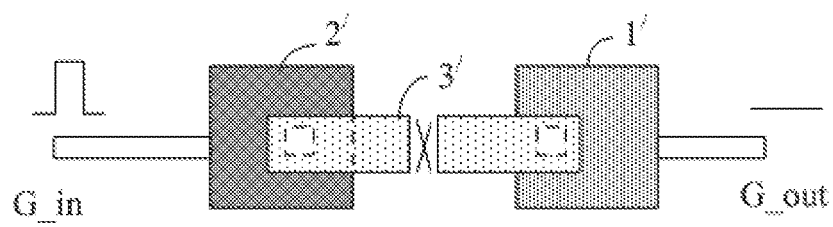
FIG. 4 is the schematic view of the electrostatic breakdown of the ESD protection circuit in FIG. 1.
Figure 5:
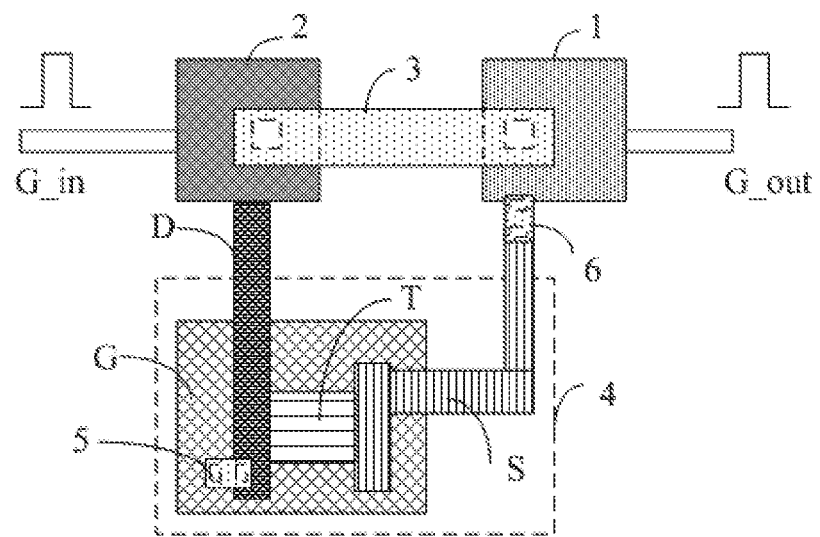
FIG. 5 is the schematic circuit of the ESD protection circuit of the present invention.

With reference to FIG. 5, in the present embodiment, it provides an ESD protection circuit disposed on a display panel. The ESD protection circuit comprises a first conductive via layer 3 electrically connected with a first signal line 1 for outputting signal G_out and a second signal line 2 for inputting signal G_in, and a thin film transistor 4.

A gate G of the thin film transistor 4 is electrically connected with a drain D, and the second signal line 2 is electrically connected with the gate G and/or the drain D of the thin film transistor, and the first signal line 1 is electrically connected with a source S of the thin film transistor 4.

In one embodiment of the present invention, the gate G of the thin film transistor 4 and the first signal line 1 are made by a first metal layer of the display panel, and the source S and the drain D of the thin film transistor 4 and the second signal line 2 are made by a second metal layer of the display metal; wherein the gate G of the thin film transistor 4 is connected to the drain D of the thin film transistor 4 with a second conductive via layer 5, the drain D of the thin film transistor 4 is electrically connected to the second signal line 2, and the source S of the thin film transistor 4 is connected to the first signal line 1 with a third conductive via layer 6. This is for simplifying the manufacturing process.

In one embodiment of the present invention, an active layer T is disposed between the gate G and the source S and the drain D for forming a conductive channel, and the active layer T is disposed between the first metal layer and the second metal layer.

In one embodiment of the present invention, the first conductive via layer, the second conductive via layer and the third conductive via layer are formed with ITO.

Figure 6:
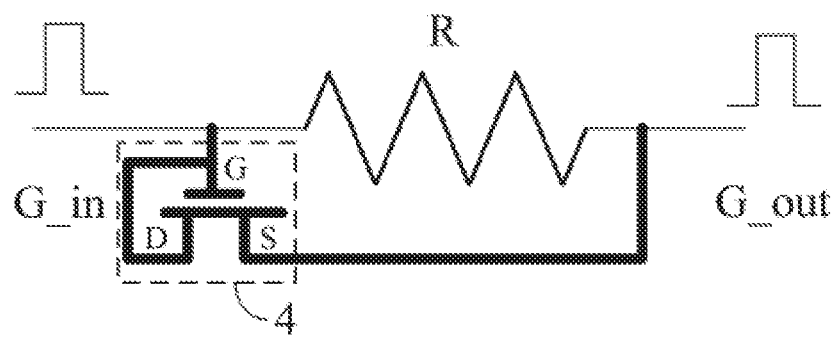
FIG. 6 is the equivalent diagram of the circuit in FIG. 5.

In one embodiment of the present invention, the ESD protection circuit can be interpreted as the equivalent circuit in FIG. 6 and it works as below:

(1) when the conventional ESD circuit is normal, i.e. the first conductive via layer 3 is electrically connected with the first signal line 1 and the second signal line 2, the input signal G_in can be outputted normally with the output signal G_out. The thin film transistor 4 can protect itself. At this time, the voltage of the gate G, the source S and the drain D of the thin film transistor 4 are the same, and the thin film transistor 4 is OFF. Therefore, even if there is current on the thin film transistor 4, it will not damage the thin film transistor 4; and (2) when the conventional ESD circuit is damaged, i.e. the first conductive via layer 3 is electrically disconnected with the first signal line 1 and the second signal line 2, the voltage of the gate G of the thin film transistor 4 is higher than the voltage of the source S of the thin film transistor 4, and the thin film transistor 4 is ON to allow the output signal G_out to be outputted normally. At this time, the second conductive via layer 5 and the second signal line 2 can be electrically connected by the thin film transistor 4. The third conductive via layer 6 can be electrically connected with the first signal line 1, and the third conductive via layer 6 can be acting as the ESD protection circuit.

Besides, In the second embodiment of the present invention, it also provides a display panel comprising the ESD protection circuit in the first embodiments. The structure and connection of the ESD protection circuit in the second embodiment is the same as the first embodiment. Therefore, the details would not be repeated herein.

The third embodiment of the present invention provides a display device which comprise the ESD protection circuit in the first embodiment. The structure and connection of the ESD protection circuit in the third embodiment is the same as the second embodiment. Therefore, the details would not be repeated herein.

Overall, comparing with the conventional ESD protection circuit, this invention provides a thin film transistor electrically bridged between the first conductive layer and the second conductive layer. When the overloaded static electricity accumulation occurs and the first conductive via layer is disconnected, the electrical connection between the first metal layer and the second metal layer can be maintained due to the activation of the thin film transistor. This can solve the output issues of the disconnection of the conductive via layer due to the overloaded static electricity accumulation.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. An ESD protection circuit of a display panel, comprising a first conductive via layer electrically connected with a first signal line for outputting signal and a second signal line for inputting signal, and a thin film transistor;
   wherein a gate of the thin film transistor is electrically connected with a drain, and the second signal line is electrically connected with the gate and/or the drain of the thin film transistor, and the first signal line is electrically connected with a source of the thin film transistor;
   wherein the gate of the thin film transistor and the first signal line are arranged on a first metal layer of the display panel, and the source and the drain of the thin film transistor and the second signal line are arranged on a second metal layer of the display panel;
   wherein the gate of the thin film transistor is connected to the drain of the thin film transistor with a second conductive via layer, the drain of the thin film transistor is electrically connected to the second signal line, and the source of the thin film transistor is connected to the first signal line with a third conductive via layer.

2. The circuit according to claim 1, further comprising an active layer disposed between the gate and the source and the drain for forming a conductive channel, wherein the active layer is disposed between the first metal layer and the second metal layer.

3. The circuit according to claim 2, the first conductive via layer, the second conductive via layer and the third conductive via layer are formed with ITO.

4. The circuit according to claim 3, wherein the voltage of the gate, the source and the drain of the thin film transistor are the same, and the thin film transistor is OFF when the first signal line is connected to the second signal line with the first conductive via layer.

5. The circuit according to claim 4, wherein the voltage of the gate of the thin film transistor is higher than the voltage of the source of the thin film transistor, and the thin film transistor is ON when the first signal line is disconnected to the second signal line with the first conductive via layer.

6. A display panel, comprising an ESD protection circuit disposed on the display panel, wherein the ESD protection circuit comprises:
   a first conductive via layer electrically connected with a first signal line for outputting signal and a second signal line for inputting signal, and a thin film transistor;
   wherein a gate of the thin film transistor is electrically connected with a drain, and the second signal line is electrically connected with the gate and/or the drain of the thin film transistor, and the first signal line is electrically connected with a source of the thin film transistor;
   wherein the gate of the thin film transistor and the first signal line are arranged on a first metal layer of the display panel, and the source and the drain of the thin film transistor and the second signal line are arranged on a second metal layer of the display panel;
   wherein the gate of the thin film transistor is connected to the drain of the thin film transistor with a second conductive via layer, the drain of the thin film transistor is electrically connected to the second signal line, and the source of the thin film transistor is connected to the first signal line with a third conductive via layer.

7. The display panel according to claim 6, further comprising an active layer disposed between the gate and the source and the drain for forming a conductive channel, wherein the active layer is disposed between the first metal layer and the second metal layer.

8. The display panel according to claim 7, the first conductive via layer, the second conductive via layer and the third conductive via layer are formed with ITO.

9. The display panel according to claim 8, wherein the voltage of the gate, the source and the drain of the thin film transistor are the same, and the thin film transistor is OFF when the first signal line is connected to the second signal line with the first conductive via layer.

10. The display panel according to claim 9, wherein the voltage of the gate of the thin film transistor is higher than the voltage of the source of the thin film transistor, and the thin film transistor is ON when the first signal line is disconnected to the second signal line with the first conductive via layer.

11. A display device, comprising a display panel, and an ESD protection circuit disposed on the display panel, wherein the ESD protection circuit comprises:
   a first conductive via layer electrically connected with a first signal line for outputting signal and a second signal line for inputting signal, and a thin film transistor;
   wherein a gate of the thin film transistor is electrically connected with a drain, and the second signal line is electrically connected with the gate and/or the drain of the thin film transistor, and the first signal line is electrically connected with a source of the thin film transistor;
   wherein the gate of the thin film transistor and the first signal line are arranged on a first metal layer of the display panel, and the source and the drain of the thin film transistor and the second signal line are arranged on a second metal layer of the display panel;
   wherein the gate of the thin film transistor is connected to the drain of the thin film transistor with a second conductive via layer, the drain of the thin film transistor is electrically connected to the second signal line, and the source of the thin film transistor is connected to the first signal line with a third conductive via layer.

12. The display panel according to claim 11, further comprising an active layer disposed between the gate and the source and the drain for forming a conductive channel, wherein the active layer is disposed between the first metal layer and the second metal layer.

13. The display panel according to claim 11, the first conductive via layer, the second conductive via layer and the third conductive via layer are formed with ITO.

14. The display panel according to claim 13, wherein the voltage of the gate, the source and the drain of the thin film transistor are the same, and the thin film transistor is OFF when the first signal line is connected to the second signal line with the first conductive via layer.

15. The display panel according to claim 14, wherein the voltage of the gate of the thin film transistor is higher than the voltage of the source of the thin film transistor, and the thin film transistor is ON when the first signal line is disconnected to the second signal line with the first conductive via layer.

* * * * *